United States Patent
Favaron et al.

(10) Patent No.: US 9,702,461 B2
(45) Date of Patent: Jul. 11, 2017

(54) PISTON RING

(75) Inventors: Rodrigo Favaron, Sao Paulo (BR); Gisela A. Marques, Jundiaí (BR)

(73) Assignees: MAHLE Metal Leve S.A., Jundiai (BR); MAHLE International GmbH, Stuttgart (DE)

( * ) Notice: Subject to any disclaimer, the term of this patent is extended or adjusted under 35 U.S.C. 154(b) by 436 days.

(21) Appl. No.: 14/239,257

(22) PCT Filed: Aug. 17, 2012

(86) PCT No.: PCT/BR2012/000365
§ 371 (c)(1),
(2), (4) Date: Jul. 28, 2014

(87) PCT Pub. No.: WO2013/023270
PCT Pub. Date: Feb. 21, 2013

(65) Prior Publication Data
US 2015/0076769 A1    Mar. 19, 2015

(30) Foreign Application Priority Data

Aug. 17, 2011 (BR) ...................... 1103935

(51) Int. Cl.
*F16J 9/26* (2006.01)
*F16J 9/00* (2006.01)
(Continued)

(52) U.S. Cl.
CPC   *F16J 9/26* (2013.01); *C23C 8/26* (2013.01); *C23C 14/0641* (2013.01);
(Continued)

(58) Field of Classification Search
CPC . F16J 9/00; F16J 9/26; C23C 14/0641; C23C 28/044
See application file for complete search history.

(56) References Cited

U.S. PATENT DOCUMENTS 5,154,433 A * 10/1992 Naruse ........................ F16J 9/26
277/443
6,139,022 A * 10/2000 Iwashita ................. C23C 16/26
277/442

(Continued)

FOREIGN PATENT DOCUMENTS

CN    101253353 A    8/2008
CN    101365899 B   11/2010
(Continued)

OTHER PUBLICATIONS

Bachmaier, "Coating Development for Piston Rings", Diploma Thesis. Loeben, Feb. 2008. http://www.unileoben.ac.at/images/stories/Bibliothek/edoc/AC06674809n01vt.pdf.*

(Continued)

*Primary Examiner* — Nicholas L Foster
(74) *Attorney, Agent, or Firm* — Alston & Bird LLP

(57) ABSTRACT

A piston ring for at least one of a piston of an internal combustion engine and a compressor may include at least one substantially annular metallic base having a nitrided layer. The base may include at least one chamfer and at least one outer surface that maintains contact with a layer of lubricating oil. The nitrided layer may exhibit a substantially constant thickness over at least one surface of the base and the at least one chamfer. The nitrided layer may include a nitrided diffusion layer that maintains direct contact with the layer of lubricating oil and has a residual tension ranging from +100 megapascal to –100 megapascal.

12 Claims, 3 Drawing Sheets

US 9,702,461 B2
Page 2

(51) Int. Cl.
*C23C 28/04* (2006.01)
*C23C 14/06* (2006.01)
*C23C 8/26* (2006.01)
*C23C 16/02* (2006.01)
*C23C 16/30* (2006.01)

(52) U.S. Cl.
CPC .......... *C23C 16/0272* (2013.01); *C23C 16/30* (2013.01); *C23C 28/044* (2013.01); *F16J 9/00* (2013.01)

(56) References Cited

U.S. PATENT DOCUMENTS

| | | | |
|---|---|---|---|
| 6,698,736 B2 | 3/2004 | Dugas et al. | |
| 7,891,669 B2* | 2/2011 | Araujo | C23C 14/0036 204/192.15 |
| 9,163,726 B2* | 10/2015 | Favaron | F16J 9/26 |
| 2002/0117808 A1* | 8/2002 | Ogawa | C23C 8/26 277/443 |
| 2006/0032602 A1* | 2/2006 | Inoue | B22D 17/2209 164/312 |
| 2006/0269790 A1* | 11/2006 | Sarabanda | C23C 14/025 428/698 |
| 2007/0099014 A1* | 5/2007 | McCullough | C23C 4/10 428/469 |
| 2007/0252338 A1* | 11/2007 | Maier | C23C 14/024 277/443 |
| 2008/0136116 A1* | 6/2008 | Sarabanda | C23C 14/025 277/443 |
| 2008/0256794 A1* | 10/2008 | Maier | C23C 8/02 29/888.07 |
| 2009/0011225 A1* | 1/2009 | Moronuki | C23C 14/022 428/334 |
| 2009/0278320 A1* | 11/2009 | Araujo | C23C 14/0036 277/442 |
| 2012/0248710 A1* | 10/2012 | Favaron | F16J 9/22 277/443 |
| 2013/0052477 A1* | 2/2013 | Lechthaler | C23C 14/0641 428/623 |
| 2014/0125013 A1* | 5/2014 | Sekiya | C23C 14/0641 277/442 |
| 2014/0137733 A1* | 5/2014 | Sekiya | C23C 14/0641 92/172 |

FOREIGN PATENT DOCUMENTS

| | | |
|---|---|---|
| JP | 63-280960 | 11/1988 |
| JP | 03090520 B2 | 9/2000 |
| JP | 2002-061746 A | 2/2002 |

OTHER PUBLICATIONS

English abstract for JP63-280960.
English abstract for JP2002-61746.
European Patent Office, Intention to Grant for Application No. 12781266.7, Jul. 7, 2015, 19 pages, Netherlands.
International Searching Authority, International Search Report and Written Opinion for Application No. PCT/BR2012/000365, Jan. 23, 2013, 8 pages, European Patent Office, Netherlands.
State Intellectual Property Office of the P.R.C., First Office Action, including Search Report, for Application No. 201280050778.2, Jun. 3, 2015, 11 pages, China.
State Intellectual Property Office of the P.R.C., Notification to Grant Patent Right for Application No. 201280050778.2, Jul. 26, 2016, 4 pages, China.
State Intellectual Property Office of the P.R.C., Second Office Action for Application No. 201280050778.2, Jan. 26, 10 pages, China.

* cited by examiner

PISTON RING

CROSS REFERENCE TO RELATED APPLICATIONS

This application is a U.S. National Phase Application of PCT/BR2012/000365, filed on Aug. 17, 2012, which claims priority to Brazilian Patent Application No. PI1103935-3, filed on Aug. 17, 2011, the contents of which are both hereby incorporated by reference in their entirety.

TECHNICAL FIELD

The present invention refers to a piston ring, particularly designed for use on the piston groove of an internal combustion engine and/or compressor, provided with a metallic base, to which a nitrided layer consisting exclusively of the diffusion layer is applied throughout the surface.

BACKGROUND

On internal combustion engines having one or more pistons that displaces inside respective cylinders, each piston comprising one or more rings, which are subjected to severe strains when the engine is running.

One of the ways to guarantee resistance to wear of a ring, so that it can have long useful life, is the application of one or more coating layers onto the base metal from which it is built. Thus, the coating, developed specifically for resisting wear and abrasion, can maintain the performances properties of the ring, even after millions of cycles of piston displacement inside the cylinder.

One of the most common surface treatments between piston rings is achieved by means of a nitriding layer on the wing surface, but other coatings may be deposited onto the ring surface.

It should be noted that the nitrided layer comprises two layers, which are the diffusion layer and subsequently the white layer composed by iron nitride phase.

In the case of rings of the prior art, this is not different, and therefore the traditional processes of making nitrided piston rings have both the diffusion layer and the compound layer. As a characteristic, the while layer is very hard, fragile and porous. In turn, the live edges of a piston ring are tension concentration points. When these regions receive the nitrided white layer, there is a significant increase in the concentration of tensions, which leads to a more rapid fracture of the ring.

FIG. 1 shows exactly the above-described phenomenon. An attentive observation of FIG. 1 shows how the crack of the component began at the left lower chamfer, extending into the total fracture, a typical situation with piston rings.

Although there are evidences showing that a compressive residual tension is advantageous on preventing the formation of cracks, the same compressive residual tension is different when it exists at the edges of a piston ring.

As shown in FIG. 2, a nitrided layer on the ring surface in a region close to an edge results on vectors V1 and V2. The combination of the compressive tensions of vectors V1 and V2 in the edge region result in a third vector V3, which contributes to forming the crack and may lead to fracture of the component when it is subjected to severe functioning conditions.

It should be noted that the piston rings further receive hard films, generally generated by physical vapor deposition (PVD) or chemical vapor deposition (CVD). In the solutions of the prior art, the ring surfaces that will receive the hard film require removal of the hard layer from the compound, with a view to improve adhesion of such a hard film.

In general, the methods used for removing the white layer require machining the ring by a grinding process. These processes are known as potential generators of cracks due to the cutting forces generated during the machining. Considering that the nitrided layer in the chamfer regions already have high residual tension, said machining may cause little fractures on these surfaces. Given the cyclic physical strains to which the piston ring is subjected, a small fracture may easily lead to break of the component.

The results presented in the table below show the increase in residual tension after machining the nitrided layer of the prior art. It should be noted that the residual tension after nitriding increased by about 300 Mpa to about 600 Mpa after the machining.

TABLE 1 a comparison between the values of residual tension after nitriding and after machining.

| Sample | After nitriding MPa 180° | After machining MPa 180° |
|---|---|---|
| $1^{st}$ ring | −229 | −534 |
| $2^{nd}$ ring | −198 | −745 |
| $3^{rd}$ ring | −312 | −619 |
| $4^{th}$ ring | −296 | −617 |
| $5^{th}$ ring | −226 | −728 |

In order to improve the fracture resistance of nitrided piston rings, which naturally may also receive a hard film, various alternatives have been developed. One first prior technique representative of such attempts is presented by U.S. Pat. No. 6,698,736, which refers to a piston ring on which the nitrided layer is completely removed from the chamfer regions, since its presence is harmful to the fracture resistance.

Thus, the document discloses that it is necessary to carry out nitriding with the ring having its live edges, or with extremely reduced chamfers, because otherwise it is not possible to remove completely the nitrided layer in such regions. As explained above, these regions are strong concentrations of tensions that increase with nitriding. In this regard, the technology proposed by U.S. Pat. No. 6,698,736 is vulnerable, because, if the nitrided layer is not completely removed from the edges, the fact that the residual nitrided layer contains residual tensions will impair the fracture resistance of the component.

Another prior technique is presented by the Japanese patent application JP 2002-061746, which describes a piston ring having a metallic base of cast iron or steel. Such a ring comprises a concave portion in the region of the axial center of the outer face, where a nitrided layer is formed. After removal of the nitrided layer from the chamfer and corner regions, a hard ceramic film layer is deposited onto the outer face. Just as happens in the technology presented by the above patent, the nitrided layer is removed from the corners by machining or by a grinding process to form the chamfers. In order for this technology to be feasible, it is necessary that the corners should have live edges before receiving the nitrided layer, otherwise it will not be possible to remove the nitrided layer totally. Thus, the machining of the nitrided live edges that have a high level of tensions lead to the generation of cracks that will impair the resistance of the ring, causing fracture thereof.

Japanese document JP3090520 discloses another solution found in the prior art to the problems described above. In this case, a piston ring of stainless steel is provided with nitrided layers on the upper, lower surfaces and on its inner diameter, receiving also a ceramic film by ionic deposition onto the peripheral outer surface. It should be noted that, in this case, the nitriding treatment takes place after the PVD, so that the PVD hard film will act as a barrier that prevents nitriding. The disadvantage of this invention is due to the fact that only the PVD film will support the slide surface that undergoes wear. It should be noted that, if the PVD film is totally consumed, there will be no nitriding layer under the PVD film capable of continuing to support the wear. Thus, the life of the piston ring depends completely on the durability of the PVD film and, is the latter becomes extinguished, the soft material that composes the metallic base will be exposed to the cylinder wall, which causes wear of the ring and, as a result, the break of the motor.

Thus, the solutions presented by the prior art have two great drawbacks, which have not been eliminated so far. On the one side, in the technologies where nitriding is carried out on the whole ring, one needs machining processes capable of removing it totally, so that the deposition of the hard ceramic film can have good adhesion. On the other hand, the fact that the hard ceramic film is deposited directly onto the metallic base of the piston ring brings the drawback of the life of the piston ring depending completely on the durability of the PVD film.

Therefore, no solution has been found to enable nitriding over the whole surface of the piston ring and enable good adhesion of a hard ceramic film without the need for any intermediate machining process, that is, deposited over the nitrided layer.

The present invention has the objective of providing a piston ring designed for use on internal combustion engines or compressors, provided with a special nitriding surface treatment, so that at least one of its nitrided surfaces will receive a hard ceramic film with good adhesion and without the need for machining processes.

The present invention has also the objective of providing a piston ring provided with a nitriding surface treatment applied onto the ring, the chamfers of which are in their final geometry, and that is capable of minimizing the internal tensions of the nitrided layer.

The present invention has a further objective of providing a piston ring that will guarantee an extended life of the piston ring, so that, when the PVD film has been consumed, a nitrided layer existing under the PVD film will enable the functioning of an engine in full conditions.

SUMMARY

The objectives of the present inventions are achieved by means of a piston ring, particularly for use in the groove of the piston of an internal combustion engine or of a compressor, comprising at least one substantially annular metallic base, composed chiefly by iron and to which a nitrided layer is associated, the piston ring comprising at least one outer surface that maintains contact with a film of lubricating oil and is provided with at least one chamfer, the nitrided layer presenting a substantially constant thickness throughout the base surface, including the region of said at least one chamfer, the nitrided layer that consists exclusively of a nitrided diffusion layer that maintains direct contact with the external environment and that has residual tension ranging from +100 megapascal to −100 megapascal.

BRIEF DESCRIPTION OF THE DRAWINGS

The present will now be described in greater detail with reference to an example of embodiment represented in the drawings. The figures show.

DETAILED DESCRIPTION

The present invention refers to a piston ring, particularly for use in the groove of a piston of an internal combustion engine, and such a ring may be applied both as compression ring and as oil-scraping ring.

As described above, in order for a piston ring to maintain its performance during millions of cycles, the metallic base 10 by which it is formed needs to receive an adequate surface treatment.

In the case of the present invention, the piston ring will receive at least one special nitriding treatment. In this regard, it should be noted that the metallic base 10 of the piston ring compatible with such a treatment should be composed mainly by iron, and one may use cast iron, steel, stainless steel, martensitic stainless steel, or any other alloy that proves to be compatible.

The main characteristics of the piston ring of the present invention are due to that fact that it is subjected to surface treatment only in its final form. In other words, the ring will be subjected to the special nitriding treatment after being provided with the chamfers 15 in its final dimension, and does not require any machining process after the special nitriding treatment.

Figure 1:
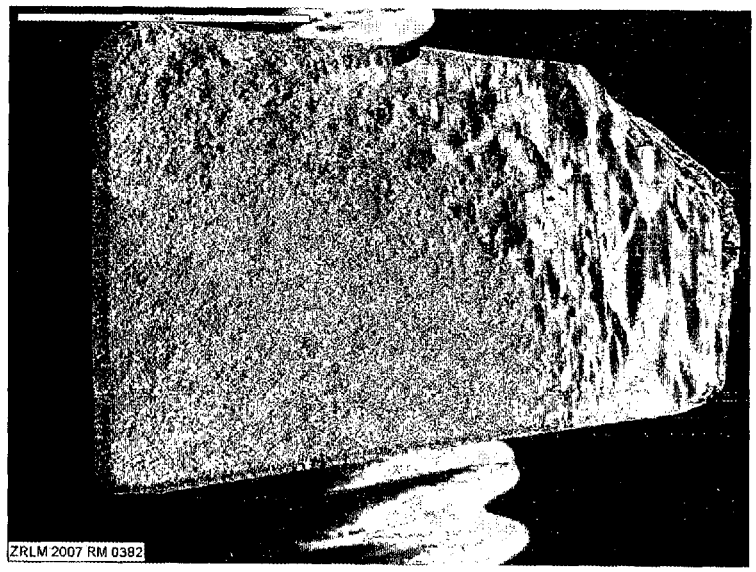
FIG. 1 is a photograph of a piston ring showing the origin of a crack that has led to break of the ring.
Figure 2:
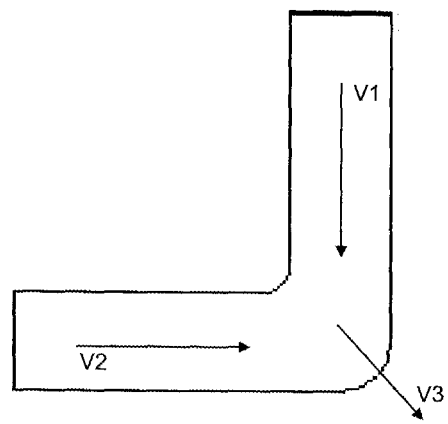
FIG. 2 shows the actuation of the concentration of tensions on a region of an edge of the piston ring.

Such a characteristic brings per se an advantage over the prior art, since the component is not subjected to additional internal tensions resulting from machining On the other hand, the size of the chamfers 15 may be larger, so as to prevent live edges at the ring corners, which, as shown in FIG. 2, enables one to prevent high concentrations of tensions.

The sum of the combination provided by the possibility of using larger chamfers 15 with the fact that the component is not subjected to a machining process enables one to reduce significantly the compressive tensions of the component after nitriding.

Figure 3:
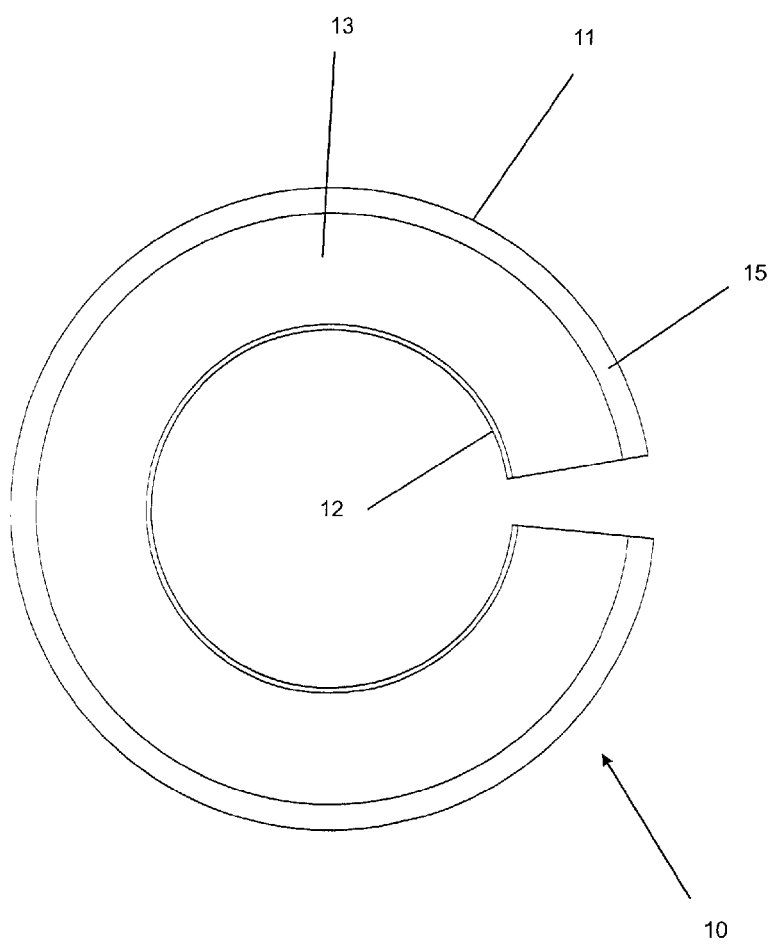
FIG. 3 shows a piston ring of the of the present invention.
Figure 4:
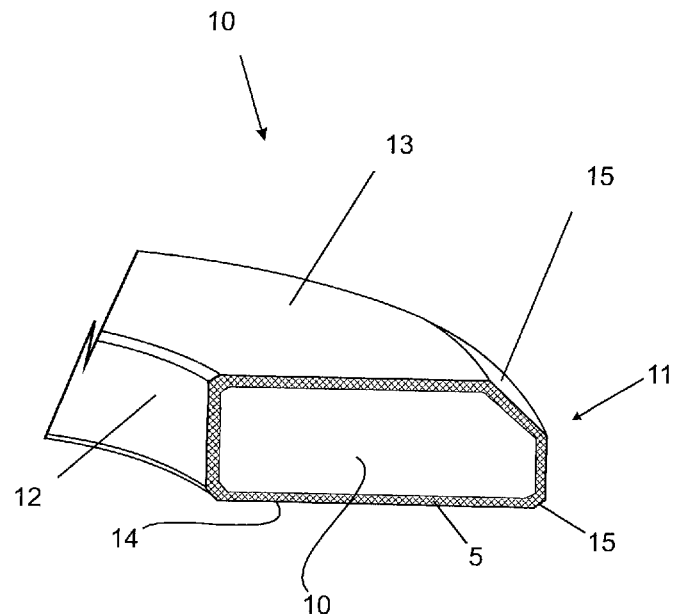
FIG. 4 shows a piston ring of the present invention.

In order to achieve such a result, a piston ring comprising a substantially annular metallic base 10 is provided with at least one outer surface 11, 12, 13, 14, which will maintain contact with a layer of lubricating oil, such as a peripheral outer surface, a peripheral inner surface, an upper surface and a lower surface. It should be noted that the outer surface 11, 12, 13, 14 comprises or does not comprise a chamfer 15 that is in its final dimension (see FIGS. 3 and 4).

Taking a piston ring with the above-described geometry, one subjects the metallic base 10 to a special nitriding layer. Such a nitriding layer consists only of the two nitriding layers usually applied by the prior art. Thus, the outer surface of the base 10 receives a nitrided layer consisting of only the diffusion layer 5, without deposition of the white layer that is typically deposited onto the rings of the prior art.

It should be noted that, in order to achieve the results of the present invention, the thickness of the nitrided diffusion layer 5 should range from 20 to 150 micrometers. It should be noted that the nitrided diffusion layer 5 will be directly in contact with the external environment, that is, it will maintain contact with the film of lubricating oil of the internal combustion engine or compressor.

As already said, the white layer is very hard, fragile and porous, and so, in the case of the rings of the prior art, it has to be removed for subsequent deposition of a hard ceramic film whatever. In the case of the present invention, the metallic base is exclusively provided with a nitrided diffusion layer 5, without the need to remove it if one wishes to deposit a hard ceramic film subsequently.

Figure 5:
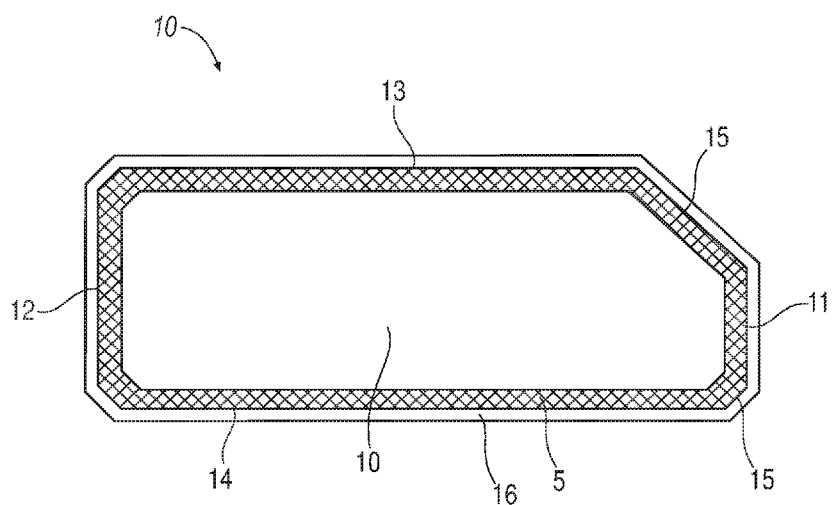
FIG. 5 shows another piston ring of the present invention.

Thus, after deposition of the nitrided diffusion layer 5, one may then deposit directly onto one of the outer surfaces 11, 12, 13, 14 a hard ceramic film 16 generated by physical vapor deposition (PVD) or by chemical vapor deposition (CVD) with a view to improve the mechanical properties. See FIG. 5.

In other words, the nitrided diffusion layer 5 is capable of receiving a hard ceramic film 16, guaranteeing good adhesion between the two coating. The existence of a white layer prevent adhesion difficulties, as well as the high compression tensions resulting from conventional nitriding, thus imparting to the piston ring of the present invention a number of benefits in its mechanical properties.

Table 2 presents a number of bench tests with a view to demonstrate the advantages resulting from the present invention with respect to residual tension. The samples were tested to evaluate the residual tension at the outer lower chamfer 15 of the rings of the present invention (Exp. 3) with respect to the rings of the prior art after nitriding (Exp. 1) and after machining the chamber 15 (Exp. 2).

TABLE 2

Comparison of the residual tension between the rings of the present invention and that of the prior art
Residual tension at the outer lower chamfer (MPa)

| Samples | Prior art | | Present invention After nitriding Exp. 3 |
|---|---|---|---|
| | After nitriding Exp. 1 | After machining the chamfer Ex. 2 | |
| 1 | −149 | −344 | −21 |
| 2 | −203 | −511 | −31 |
| 3 | −200 | −504 | −26 |
| 4 | −219 | −487 | −8 |
| 5 | −277 | −485 | −19 |
| Average | −230 | −466 | −21 |

As can be seen, the present invention exhibits residual tension values 90% lower than that found in the rings of the prior art, only because the nitriding takes place on the ring already provided with chamfers. Such results impart absolutely desirable mechanical properties for the application for which they are intended. Thus, it is evident that non-formation of the white layer is fundamental to the success of the present invention.

By nitriding the ring surfaces with only the diffusion layer, there is no need to carry out the machining step, and so the residual tension data after machining surprise with an average value 22 times lower. Indeed, a ring of the present invention may exhibit residual tension values ranging from a positive value of 100 Mpa to a negative value of 100 Mpa (+100 to −100 Mpa), which is absolutely desirable.

The present invention can invariably achieve better results when compared with the rings of the prior art. In order to corroborate this, one should observe the results presented in Table 3.

TABLE 3

Bench tests carried out with two million cycles on rings of the prior art and of the present invention.
Bench fatigue test (calculation of the tension after 2 million cycles without failure)

| Prior art | 700 MPa fatigue resistance |
|---|---|
| Present invention | 900 MPa fatigue resistance |

The above table referring to mechanical fatigue shows that the rings subjected to the special nitriding treatment of the present invention provide an improvement when compared with the rings of the prior art.

One should observe that the piston rings of the present invention have achieved an improvement of 30% in the fatigue limit as compared with conventional rings. The rings of the present invention have borne two million cycles under a tension of 900 Mpa, and the rings of the prior art bore the same number of cycles, but at a maximum tension of 700 Mpa. It should be noted that at a tension higher than 700 Mpa the rings of the prior art broke before reaching two million cycles.

In short, the present invention can prevent the drawbacks of the prior art as far as the lack of adhesion of a hard film is concerned, enabling it to be deposited directly in contact with the nitrided diffusion layer 5. On the other hand, the nitriding carried out by the prior art provides improvements in the level of the process, since it enables one to make larger chamfers 15 prior to nitriding, without the need for subsequent machining In addition to ease at production level, the piston ring of the present invention achieves mechanical properties that are markedly superior to those of the prior art, enabling the application of the rings of the present invention under severer conditions.

A preferred example of embodiment having been described, one should understand that the scope of the present invention embraces other possible variations, being limited only by the contents of the accompanying claims, which include the possible equivalents.

The invention claimed is:

1. A piston ring for at least one of piston of an internal combustion engine and a compressor, the piston ring comprising:
   at least one substantially annular metallic base having a nitrided layer, the base including at least one chamfer and at least one outer surface, the at least one outer surface being configured to maintain contact with a layer of lubricating oil;
   wherein:
   the nitrided layer is applied on the at least one chamfer and the at least one outer surface after the at least one chamfer is formed;
   the nitrided layer has a substantially constant thickness over at least one surface of the base and the at least one chamfer;
   the nitrided layer consists of a single nitrided diffusion layer that has a residual stress ranging from +100 megapascal to −100 megapascal; and
   the at least one outer surface, includes a hard ceramic film applied directly on the single nitrided diffusion layer for providing good adhesion therebetween, and the hard ceramic film is applied without any machining of the nitirded layer due to there never having been a nitrdided white layer formed on the piston ring.

2. The piston ring according to claim 1, wherein the hard ceramic film is generated via at least one of physical vapor deposition (PVD) and chemical vapor deposition (CVD).

3. The piston ring according to claim 1, wherein the annular metallic base includes at least one of stainless steel, martensitic stainless steel, iron, or cast iron.

4. The piston ring according to claim 1, wherein the annular metallic base includes a fatigue resistance greater than 800 megapascal (MPa).

5. The method according to claim 1, wherein the single nitrided diffusion layer has a thickness of 20 to 150 micrometers.

6. A method of manufacturing a piston ring, comprising:
providing a substantially annular metallic base having a peripheral outer surface, a peripheral inner surface, an upper surface, and a lower surface;
forming at least one chamfer in the annular metallic base;
nitriding at least one of the surfaces and the at least one chamfer of the annular metallic base so as to define a single nitrided. layer on the at least one of the surfaces and the at least one chamfer after the at least one chamfer is formed, the single nitrided layer consisting of a single nitrided diffusion layer having a substantially constant thickness and a residual stress ranging from +100 megapascal to −100 megapascal; and
applying a hard ceramic film directly on the single nitrided diffusion layer for providing good adhesion therebetween, and the hard ceramic film being applied without machining of the single nitirded layer prior to applying the hard ceramic film, due to there having never been a nitrided white layer formed on the piston ring.

7. The method according to claim 6, wherein the chamfer is formed via machining.

8. The method according to claim 6, further comprising generating the hard ceramic film via at least one of physical vapor deposition (PVD) and chemical vapor deposition (CVD).

9. The method according to claim 6, wherein the annular metallic base includes at least one of iron, cast iron, steel, stainless steel, or martensitic stainless steel.

10. The method according to claim 6, wherein the single nitrided diffusion layer is present on each surface of the annular metallic base.

11. The method according to claim 6, wherein the single nitrided diffusion layer has a thickness of 20 to 150 micrometers.

12. The method according to claim 11, wherein the hard ceramic film is generated via at least one of physical vapor deposition (PVD) and chemical vapor deposition (CVD).

* * * * *